United States Patent
Sheng

(10) Patent No.: US 10,015,895 B2
(45) Date of Patent: Jul. 3, 2018

(54) CASING DEVICE AND INSERTION STRUCTURE THEREOF

(71) Applicant: GETAC TECHNOLOGY CORPORATION, Hsinchu County (TW)

(72) Inventor: Yen Long Sheng, New Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 194 days.

(21) Appl. No.: 15/056,997

(22) Filed: Feb. 29, 2016

(65) Prior Publication Data

US 2017/0142850 A1    May 18, 2017

Related U.S. Application Data

(60) Provisional application No. 62/254,838, filed on Nov. 13, 2015.

(51) Int. Cl.
*F16B 13/04*    (2006.01)
*H05K 5/02*    (2006.01)
*F16B 21/08*    (2006.01)

(52) U.S. Cl.
CPC ......... *H05K 5/0208* (2013.01); *F16B 13/045* (2013.01); *F16B 21/086* (2013.01)

(58) Field of Classification Search
CPC .. F16B 21/086; F16B 13/045; F16B 19/1081; F16B 5/0642; F16B 2/243
USPC ................................................ 411/508–510
See application file for complete search history.

(56) References Cited

U.S. PATENT DOCUMENTS

| | | | | | |
|---|---|---|---|---|---|
| 2,391,298 | A | * | 12/1945 | Davis | F16B 21/086 411/508 |
| 2,408,340 | A | * | 9/1946 | Poupitch | F16B 21/086 29/270 |
| 2,509,192 | A | * | 5/1950 | Poupitch | F16B 15/06 411/508 |
| 2,560,530 | A | * | 7/1951 | Burdick | F16B 5/06 411/508 |
| 2,692,414 | A | * | 10/1954 | Poupitch | F16B 5/125 24/293 |
| 3,864,789 | A | * | 2/1975 | Leitner | B60R 13/04 24/293 |
| 8,322,801 | B2 | * | 12/2012 | Yang | F16B 5/0642 312/222 |

(Continued)

Primary Examiner — Flemming Saether

(57) ABSTRACT

A casing device and an insertion structure thereof are provided. The casing device includes a first casing, a second casing, and an insertion structure. The second casing has an engagement structure. The insertion structure includes a tamperproof element. The tamperproof element has one end extended outward to form two barb-like protruding portions and the other end protrudingly provided with a leaf spring. The leaf spring includes resilient protruding plates protrudingly formed on the outer surface of the tamperproof element. Since the resilient protruding plates and the engagement structure are engaged with each other, the insertion structures can clamp the first casing and the second casing to prevent consumers from dismantling an electronic device enclosed by the casing device but enable the electronic device manufacturers to confirm whether the casing device has been inappropriately dismantled by the consumers, thereby settling disputes over damages liability between a consumer and a manufacturer.

20 Claims, 10 Drawing Sheets

(56) References Cited

U.S. PATENT DOCUMENTS

| | | | |
|---|---|---|---|
| 8,496,420 B2* | 7/2013 | Aoki | F16B 5/0642 411/45 |
| 9,644,667 B2* | 5/2017 | Farahani | F16B 39/02 |
| 2008/0193250 A1* | 8/2008 | Boubtane | F16B 13/025 411/48 |
| 2013/0119208 A1* | 5/2013 | Geiger | F16L 3/233 248/68.1 |
| 2014/0109379 A1* | 4/2014 | Farahani | F16B 39/02 29/525.02 |

* cited by examiner

CASING DEVICE AND INSERTION STRUCTURE THEREOF

BACKGROUND OF THE INVENTION

Field of the Invention

The present invention relates to insertion structures and, more particularly, to an insertion structure for use in clamping two casings more firmly.

Description of the Prior Art

For example, a casing structure of an electronic device, such as a hard disk drive, not only encloses and protects electronic components, circuit boards and memory devices inside the electronic device but also prevents users from dismantling and repairing the electronic device. Common conventional casing structures use screws of special specifications (such as a screw with a star-shaped head) as primary fastening components whereby the users are prevented from dismantling and repairing the electronic devices.

However, the aforesaid screws of special specifications (such as a screw with a star-shaped head) have a drawback described below. Since the commercial availability of the screws of special specifications (such as a screw with a star-shaped head) is inevitably accompanied by the commercial availability of related screwdrivers, some users can still dismantle the casing structure and take electronic components, circuit boards and memory devices away from electronic devices to the detriment of electronic device manufacturers' business interests. Therefore, it is important for the electronic device manufacturers to confirm that the casing structure has been dismantled.

In view of the aforesaid drawback of the prior art, the inventor of the present invention conducts research and applies related theories to eventually overcome the aforesaid drawback of the prior art.

SUMMARY OF THE INVENTION

It is an objective of the present invention to provide a casing device and an insertion structure thereof such that moving a tamperproof element away from a penetrating hole allows resilient protruding plates to be stopped by an internal thread until they deform or rupture, thereby allowing the resilient protruding plates to rupture and fall into the penetrating hole or severely deform whenever the tamperproof element is pulled out of penetrating hole. Hence, an electronic device manufacturer can confirm whether the casing device has been inappropriately dismantled by a consumer, so as to settle disputes over damages liability between the consumer and the manufacturer.

In order to achieve the above and other objectives, the present invention provides an insertion structure, comprising: a tamperproof element with an end extended outward to form two barb-like protruding portions and another end protrudingly provided with a leaf spring, wherein the leaf spring comprises a plurality of resilient protruding plates protrudingly formed on an outer surface of the tamperproof element.

In order to achieve the above and other objectives, the present invention further provides a casing device, comprising: a first casing with a surface having an opening and another surface having a through hole in communication with the opening; a second casing having a penetrating hole in communication with the through hole, wherein the second casing and the first casing can be closed; and the insertion structure, wherein the tamperproof element is penetratingly disposed in the through hole and the penetrating hole, with the barb-like protruding portions abutting against a bottom of the opening, wherein the plurality of resilient protruding plates and an engagement structure disposed inside the penetrating hole are engaged with each other such that a portion of the first casing and a portion of the second casing are clamped between the barb-like protruding portions and the plurality of resilient protruding plates.

Advantages of the present invention are described below. The resilient protruding plates of each leaf spring are disposed at an outer rim of the tamperproof element, arranged spirally in one turn, and spaced apart from each other. The leaf springs are vertically spaced apart. The terminal ends of two adjacent ones of the resilient protruding plates vertically spaced apart are separated by a distance which is a multiple of a pitch of the internal thread. The distance is a multiple of the pitch of an internal thread; hence, the resilient protruding plates are arranged in accordance with the internal thread such that the resilient protruding plates and the internal thread are engaged with each other.

Advantages of the present invention are further described below. The tamperproof element comprises a case sleeve and a penetrating post. The barb-like protruding portions and the leaf spring are disposed on the case sleeve. The case sleeve is formed from a U-shaped metallic strip. Then, the penetrating post is penetratingly disposed in the case sleeve to abut against the barb-like protruding portions. Hence, the tamperproof element is advantageously easy to make and cheap to assemble.

Advantages of the present invention are further described below. Windows are disposed on the case sleeve and correspond in position to the resilient protruding plates, respectively. Bumps are protrudingly disposed at the penetrating post and protrudingly exposed from the windows, respectively. Therefore, if the resilient protruding plates retract, the bumps will push the resilient protruding plates 321 outward. Therefore, the resilient protruding plates and the internal thread are engaged with each other all the time.

DETAILED DESCRIPTION OF THE EMBODIMENTS

Figure 1:
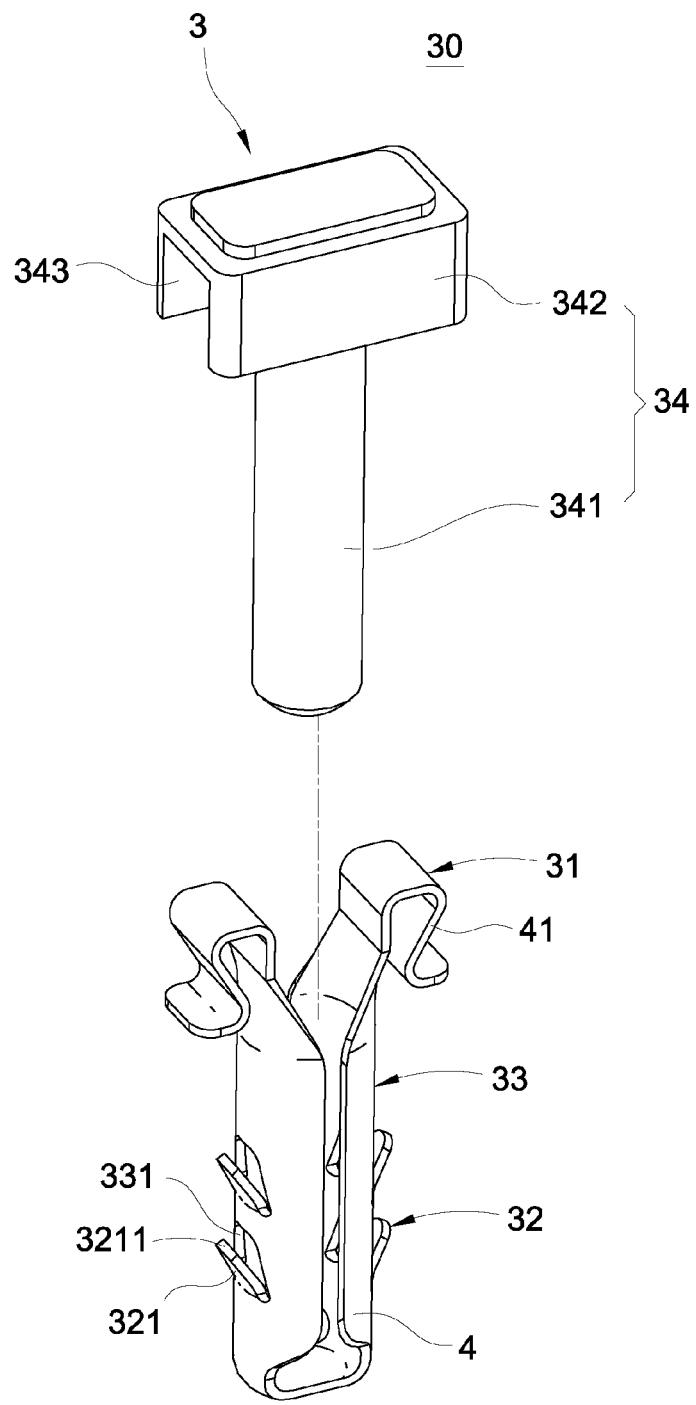
FIG. 1 is an exploded view of an insertion structure of the present invention.
Figure 2:
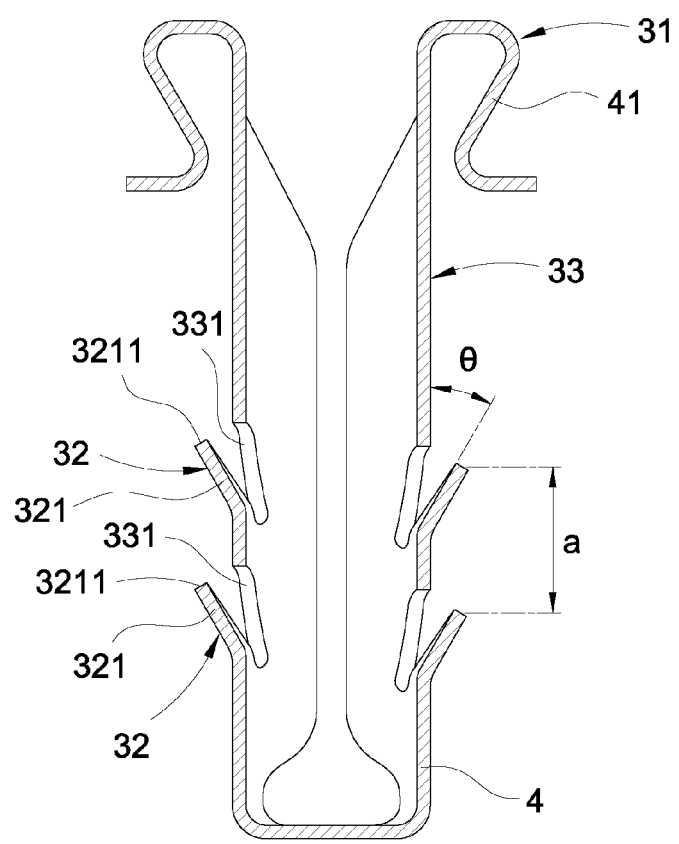
FIG. 2 is a cross-sectional view of a case sleeve of the present invention.

The details and technical features of the present invention are herein described and illustrated with drawings; however, the description is illustrative rather than restrictive of the present invention.

Referring to FIG. 1 through FIG. 5, the present invention provides a casing device 10 and insertion structures thereof. The casing device 10 essentially comprises a first casing 1, a second casing 2, and at least an insertion structure 30. The insertion structures 30 each essentially comprise a tamperproof element 3.

Figure 3:
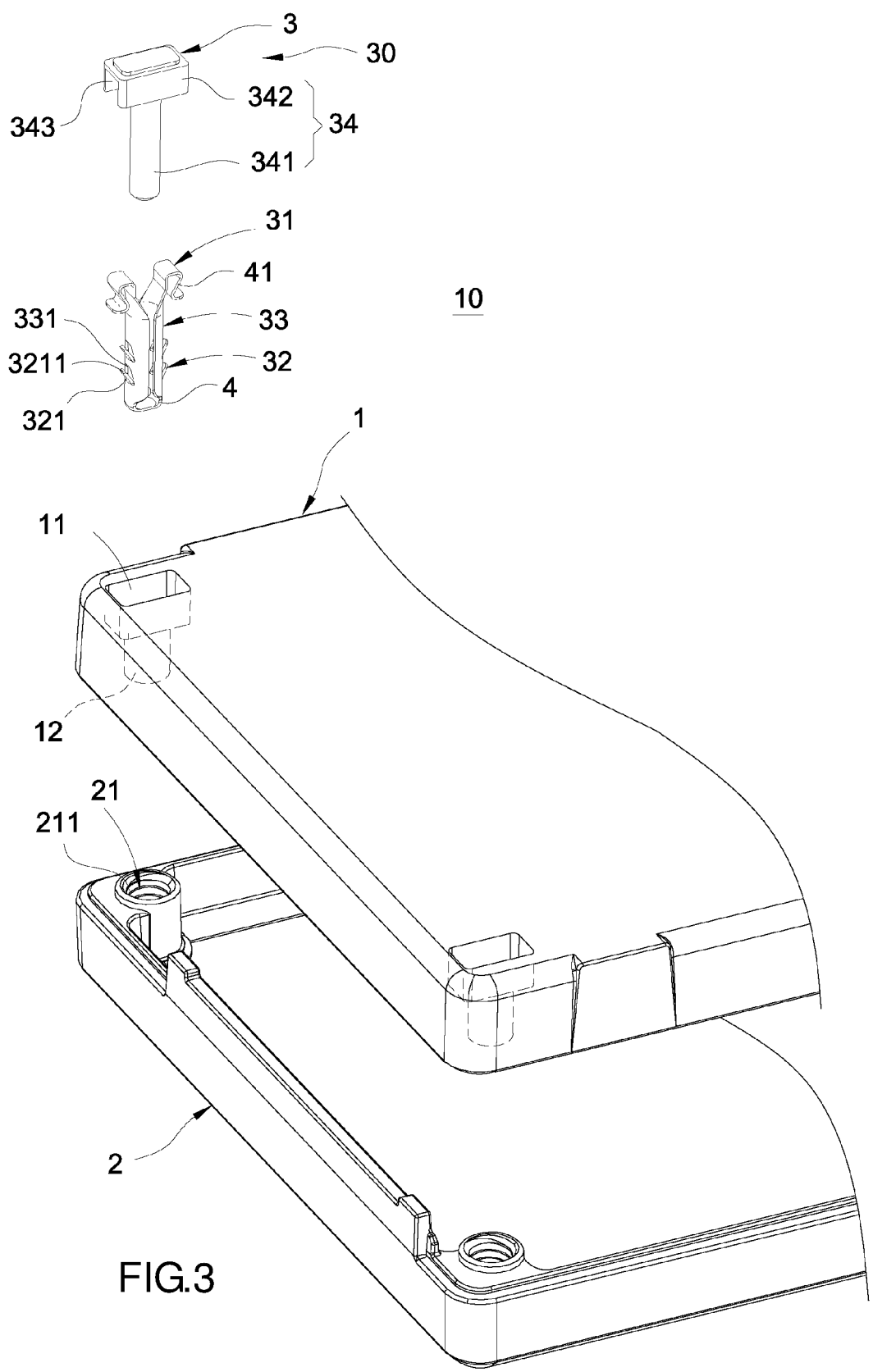
FIG. 3 is an exploded view of a casing device of the present invention.
Figure 4:
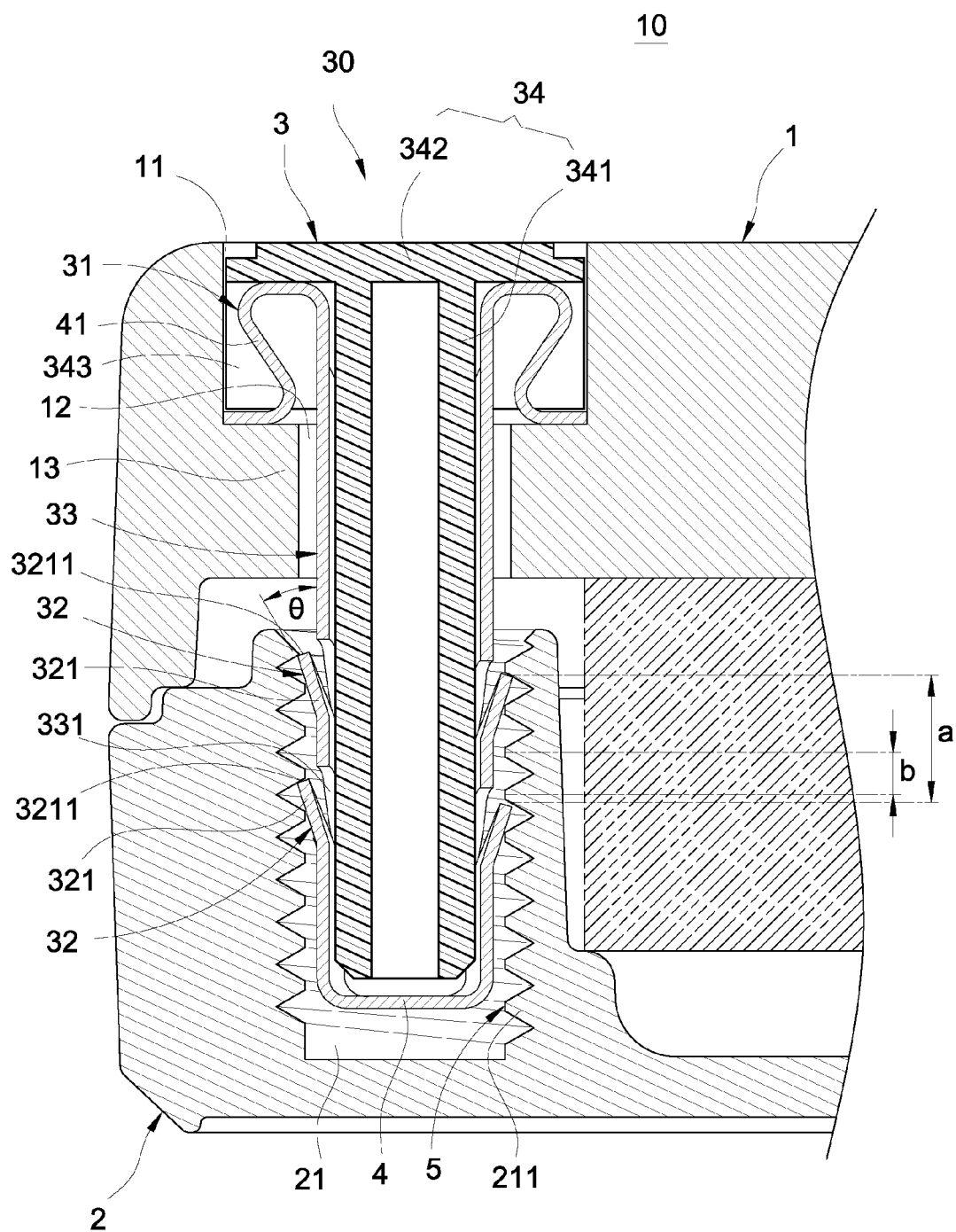
FIG. 4 is a schematic view of the casing device of the present invention.
Figure 5:
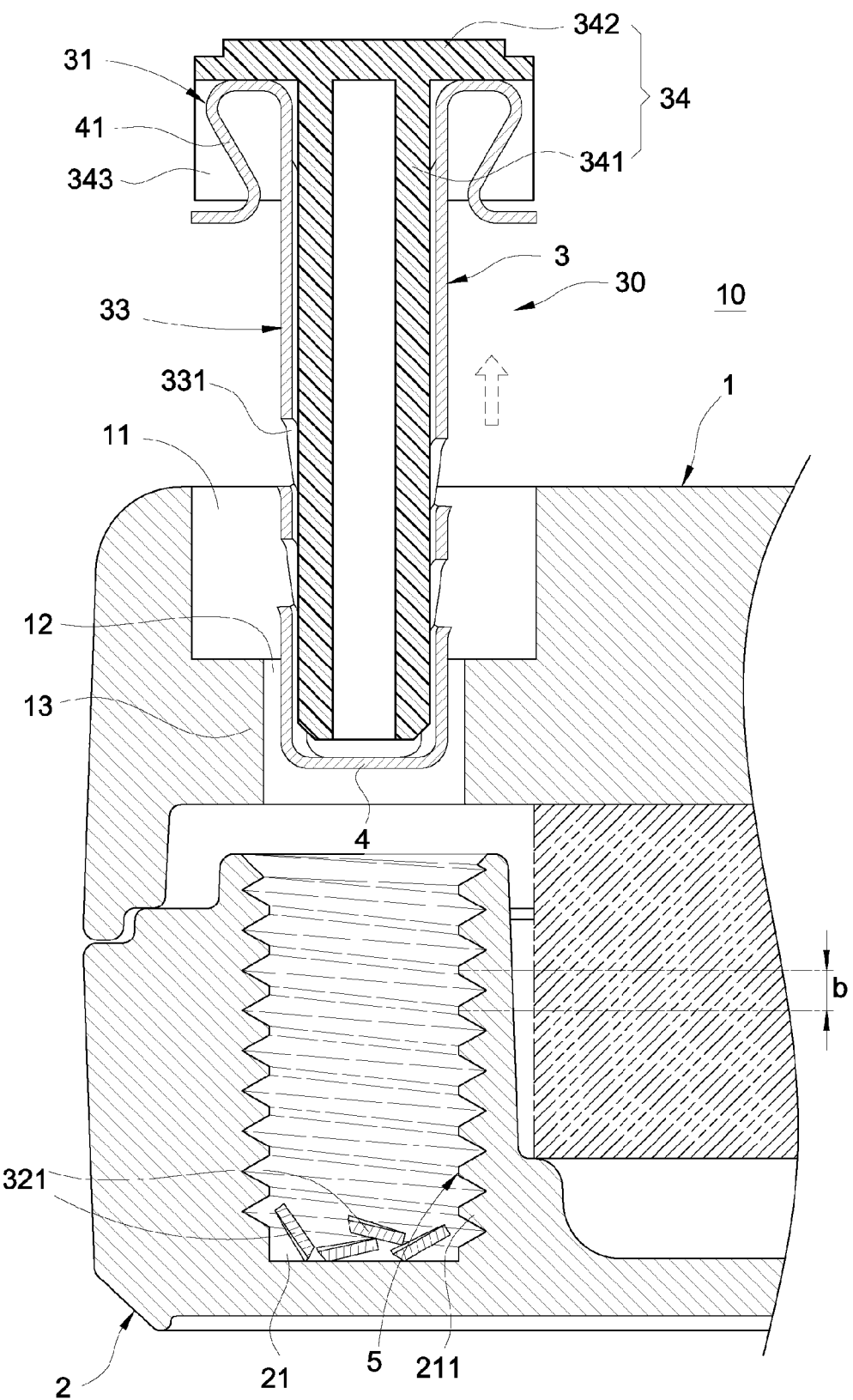
FIG. 5 is a schematic view of the operation of the casing device of the present invention.

Referring to FIG. 3 through FIG. 5, an opening 11 is disposed on one side of the first casing 1, whereas a through hole 12 in communication with the opening 11 is disposed on the other side of the first casing 1. The area of the opening 11 is larger than the area of the through hole 12, thereby allowing the first casing 1 to have an annular block 13 formed at the outer rim of the through hole 12.

Referring to FIG. 3 through FIG. 5, the second casing 2 and the first casing 1 can be closed. The second casing 2 has a penetrating hole 21. The penetrating hole 21 and the through hole 12 are in communication with each other. An engagement structure 5 is fixedly disposed in the penetrating hole 21. The engagement structure 5 comprises an internal thread 211 disposed on the inner wall of the penetrating hole 21. The opening 11, the through hole 12, the annular block 13 and the penetrating hole 21 are each provided in the number of one or more and are equal in quantity.

Referring to FIG. 1 through FIG. 5, the tamperproof element 3 equals the opening 11, the through hole 12 and the penetrating hole 21 in quantity. Each tamperproof element 3 has one end extended outward to form two barb-like protruding portions 31 and the other end protrudingly provided with at least a leaf spring 32. Each leaf spring 32 comprises a plurality of resilient protruding plates 321 protruding outward from the outer surface of the tamperproof element 3. The tamperproof elements 3 are penetratingly disposed in the through holes 12 and the penetrating holes 21, respectively. The barb-like protruding portions 31 each abut against a bottom 111 of the opening 11 (see FIG. 4). The resilient protruding plates 321 and the internal thread 211 are engaged with each other such that a portion of the first casing 1 and a portion of the second casing 2 are clamped between the barb-like protruding portions 31 and the resilient protruding plates 321; hence, the annular block 13 is sandwiched between the barb-like protruding portions 31 and the resilient protruding plates 321.

The resilient protruding plates 321 tilt and align with the barb-like protruding portions 31 to extend. An acute angle θ (see FIG. 2 and FIG. 4) is defined by and between each resilient protruding plate 321 and a corresponding one of the tamperproof elements 3. The resilient protruding plates 321 of each leaf spring 32 are disposed at the outer rim of the tamperproof element 3, arranged spirally in one turn, and spaced apart from each other.

The leaf springs 32 are vertically spaced apart. Terminal ends 3211 of two adjacent ones of the resilient protruding plates 321 vertically spaced apart are separated by a distance a. The distance a is a multiple of pitch b of the internal thread 211. For example, distance a=N*pitch; pitch b=0.5*N*pitch, where N denotes number of teeth, but the present invention is not limited thereto.

Each tamperproof element 3 comprises a case sleeve 33 and a penetrating post 34. The barb-like protruding portions 31 and the at least a leaf spring 32 are disposed on the case sleeve 33. The penetrating post 34 is penetratingly disposed in the case sleeve 33 and abuts against the barb-like protruding portions 31. The penetrating post 34 has a rod portion 341 and a head portion 342 extending from the top of the rod portion 341. The rod portion 341 is penetratingly disposed in the case sleeve 33. Two slots 343 are disposed laterally at the bottom of the head portion 342, respectively, allowing the two barb-like protruding portions 31 to engage with the two slots 343 and abut against the inner walls of the slots 343, respectively.

The two barb-like protruding portions 31 are made of a metal which exhibits resilience. The case sleeve 33 is formed from a U-shaped metallic strip 4. The two barb-like protruding portions 31 form two flaps 41 by extending the two terminal ends of the U-shaped metallic strip 4 outward and bending them reversely. The resilient protruding plates 321 are formed by cutting the U-shaped metallic strip 4 bilaterally along a cutting line and then folding the U-shaped metallic strip 4 outward about the cutting line. Windows 331 are disposed on the case sleeve 33 and positioned inward of the cutting line. Each flap 41 is a Z-shaped flap, an inverted V-shaped flap or an inverted U-shaped flap, but the present invention is not limited to the Z-shaped flap of this embodiment.

Referring to FIG. 4, the tamperproof element 3 has one end extended outward to form the barb-like protruding portions 31 and has the other end protrudingly provided with the at least a leaf spring 32. The at least a leaf spring 32 each comprise the plurality of resilient protruding plates 321 protrudingly formed on the outer surface of the tamperproof element 3, thereby forming the insertion structures 30 of the present invention.

Referring to FIG. 4, the casing device 10 of the present invention is characterized in that: the first casing 1 has a surface having the opening 11 and the other surface having the through hole 12 in communication with the opening 11. The second casing 2 and the first casing 1 can be closed. The second casing 2 has the penetrating hole 21. The penetrating hole 21 and the through hole 12 are in communication with each other. Like the aforesaid insertion structures 30, the tamperproof element 3 is penetratingly disposed in the through hole 12 and the penetrating hole 21. The barb-like protruding portions 31 abut against the bottom 111 of the opening 11. The resilient protruding plates 321 and the engagement structure 5 disposed inside the penetrating hole 21 are engaged with each other such that a portion of the first casing 1 and a portion of the second casing 2 are clamped between the barb-like protruding portions 31 and the plurality of resilient protruding plates 321.

Referring to FIG. 4, there is shown a schematic view of a state of operation of the casing device 10 and the insertion structures 30 of the present invention. The tamperproof element 3 is penetratingly disposed in the through hole 12 and the penetrating hole 21, whereas the resilient protruding plates 321 and the internal thread 211 are engaged with each other. The barb-like protruding portions 31 abut against the bottom 111 of the opening 11 such that a portion of the first casing 1 and a portion of the second casing 2 are clamped between the barb-like protruding portions 31 and the plurality of resilient protruding plates 321; hence, the first casing 1 and the second casing 2 are fastened to each other through the tamperproof element 3, and in consequence the first casing 1 and the second casing 2 can be firmly closed. Therefore, the casing device 10 not only encloses and protects electronic components, circuit boards and memory devices inside the electronic device but also prevents users from dismantling and repairing the electronic device.

Referring to FIG. 5, there is shown a schematic view of another state of operation of the casing device 10 and the insertion structures 30 of the present invention. The tamperproof element 3 moves in a direction (indicated by the arrow shown in FIG. 5) away from the penetrating hole 21 such that the plurality of resilient protruding plates 321 and the internal thread 211 are engaged with each other, thereby allowing the insertion structures 30 to clamp the first casing 1 and the second casing 2. As a result, no consumers can dismantle the casing device 10 (see FIG. 4). If consumers still attempt to pull the tamperproof element 3 out of the penetrating hole 21, the resilient protruding plates 321 will be stopped by the internal thread 211 until they deform or even rupture. Furthermore, if the tamperproof element 3 is pulled out of the penetrating hole 21, the resilient protruding plates 321 will rupture and fall into the penetrating hole 21 or severely deform (see FIG. 5, where the resilient protruding plates 321 rupture and lie at the bottom of the penetrating hole 21), and thus it will be impossible for the tamperproof element 3 to be inserted into the penetrating hole 21 again, not to mention that the resilient protruding plates 321 and the internal thread 211 can no longer be engaged with each other. Therefore, electronic device manufacturers can confirm whether the casing device 10 has been inappropriately dismantled by the consumers, thereby settling disputes over damages liability between a consumer and a manufacturer.

The resilient protruding plates 321 of each leaf spring 32 are disposed at the outer rim of the tamperproof element 3, arranged spirally in one turn, and spaced apart from each other. The leaf springs 32 are vertically spaced apart. The terminal ends 3211 of two adjacent ones of the resilient protruding plates 321 vertically spaced apart are separated by a distance a. The distance a is a multiple of pitch b of the internal thread 211; hence, the resilient protruding plates 321 are arranged in accordance with the internal thread 211 such that the resilient protruding plates 321 and the internal thread 211 are engaged with each other.

The tamperproof element 3 comprises the case sleeve 33 and the penetrating post 34. The barb-like protruding portions 31 and the at least a leaf spring 32 are disposed on the case sleeve 33. The case sleeve 33 is formed from a U-shaped metallic strip 4. Then, the penetrating post 34 is penetratingly disposed in the case sleeve 33 to abut against the barb-like protruding portions 31. Hence, the tamperproof element 3 is advantageously easy to make and cheap to assemble.

Figure 6:
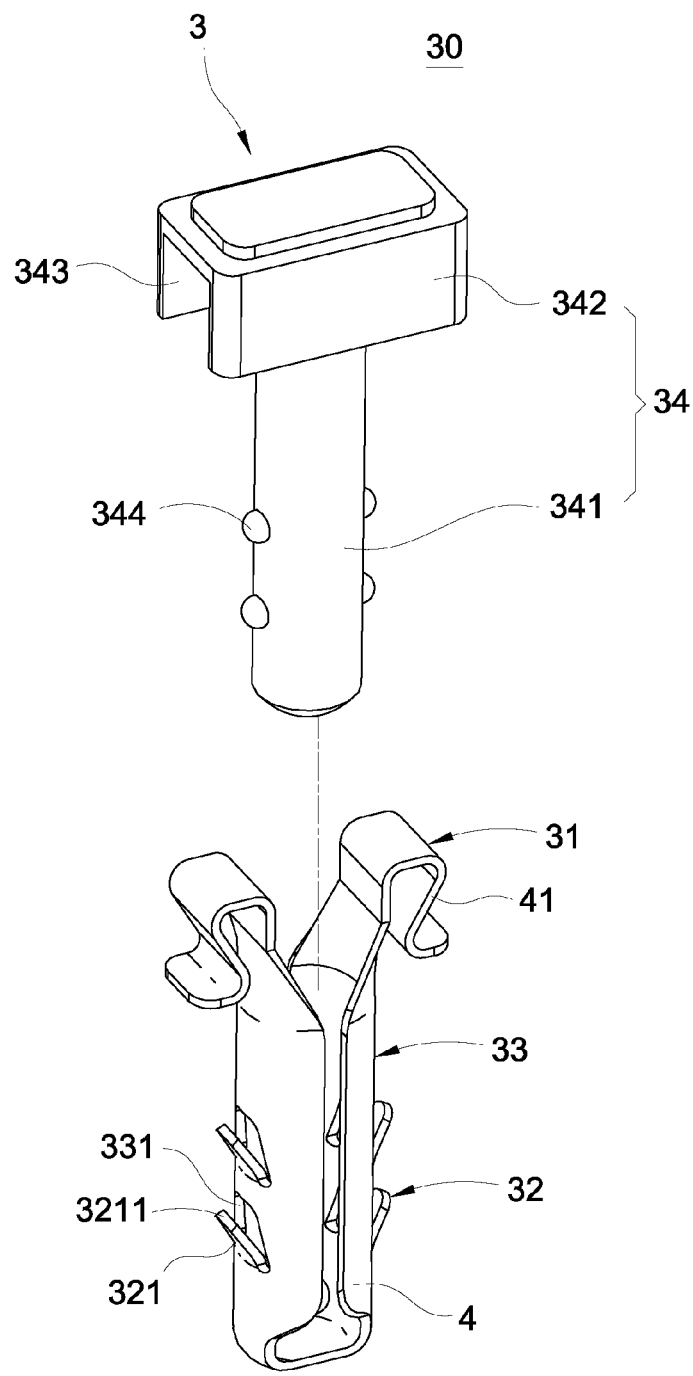
FIG. 6 is an exploded view of the insertion structure according to another embodiment of the present invention.
Figure 7:
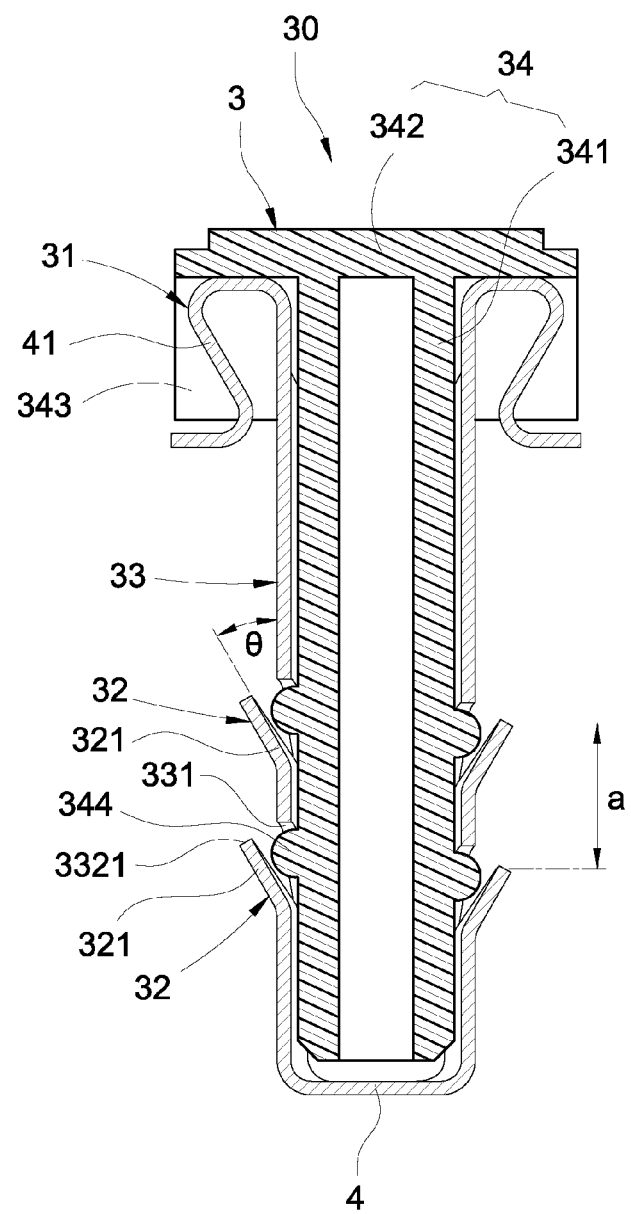
FIG. 7 is a cross-sectional view of the insertion structure according to another embodiment of the present invention.

Referring to FIG. 6 and FIG. 7, there are shown an exploded view and a cross-sectional view of the insertion structures 30 according to another embodiment of the present invention, respectively. The embodiment of FIG. 6 and FIG. 7 is substantially identical to the embodiment of FIG. 1 through FIG. 5, except that, in the embodiment of FIG. 6 and FIG. 7, a plurality of bumps 344 is protrudingly disposed at the penetrating post 34.

As shown in FIG. 6 and FIG. 7, the windows 331 are disposed on the case sleeve 33 and correspond in position to the resilient protruding plates 321, respectively, whereas the bumps 344 are protrudingly disposed at the penetrating post 34 and protrudingly exposed from the windows 331, respectively. Therefore, if the resilient protruding plates 321 retract, the bumps 344 will push the resilient protruding plates 321 outward. Therefore, the resilient protruding plates 321 and the internal thread 211 are engaged with each other all the time.

Figure 8:
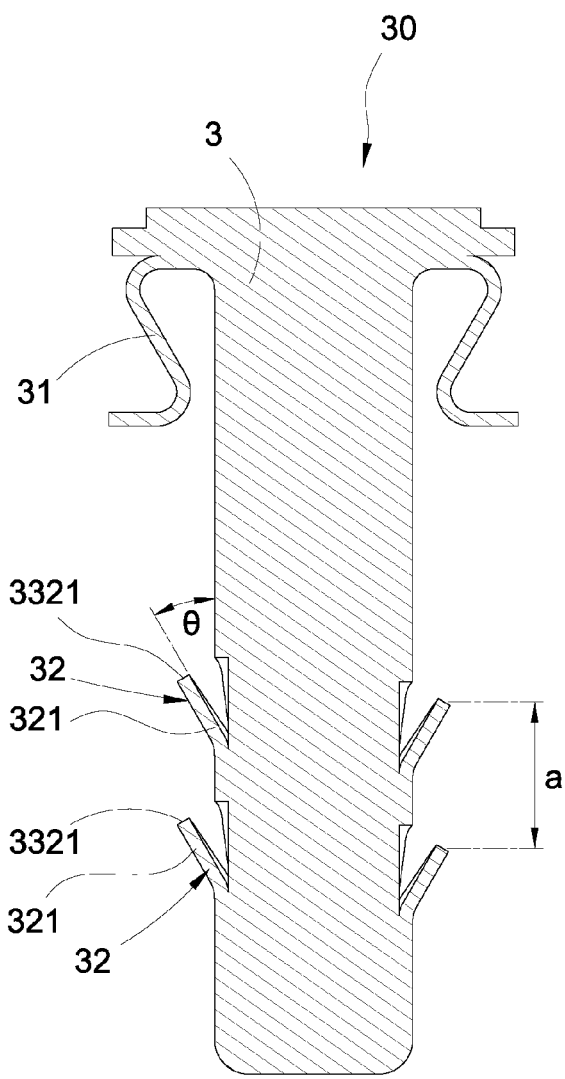
FIG. 8 is a cross-sectional view of the insertion structure according to yet another embodiment of the present invention.

Referring to FIG. 8, there is shown a cross-sectional view of the insertion structures 30 according to yet another embodiment of the present invention. The embodiment of FIG. 8 is substantially identical to the embodiment of FIG. 1 through FIG. 5. In the embodiment of FIG. 1 through FIG. 5, each tamperproof element 3 comprises the case sleeve 33 and the penetrating post 34. Unlike the embodiment of FIG. 1 through FIG. 5, the embodiment of FIG. 8 features that each tamperproof element 3 is a single post.

As shown in FIG. 8, each tamperproof element 3 is a single post, wherein the barb-like protruding portions 31 and the at least a leaf spring 32 are directly formed on the post; hence, the tamperproof element 3 has one end which forms integrally two barb-like protruding portions 31, and the tamperproof element 3 has the other end which forms integrally the at least a leaf spring 32. Therefore, the embodiment of FIG. 8 equals the embodiment of FIG. 1 through FIG. 5 in functionality and performance.

Figure 9:
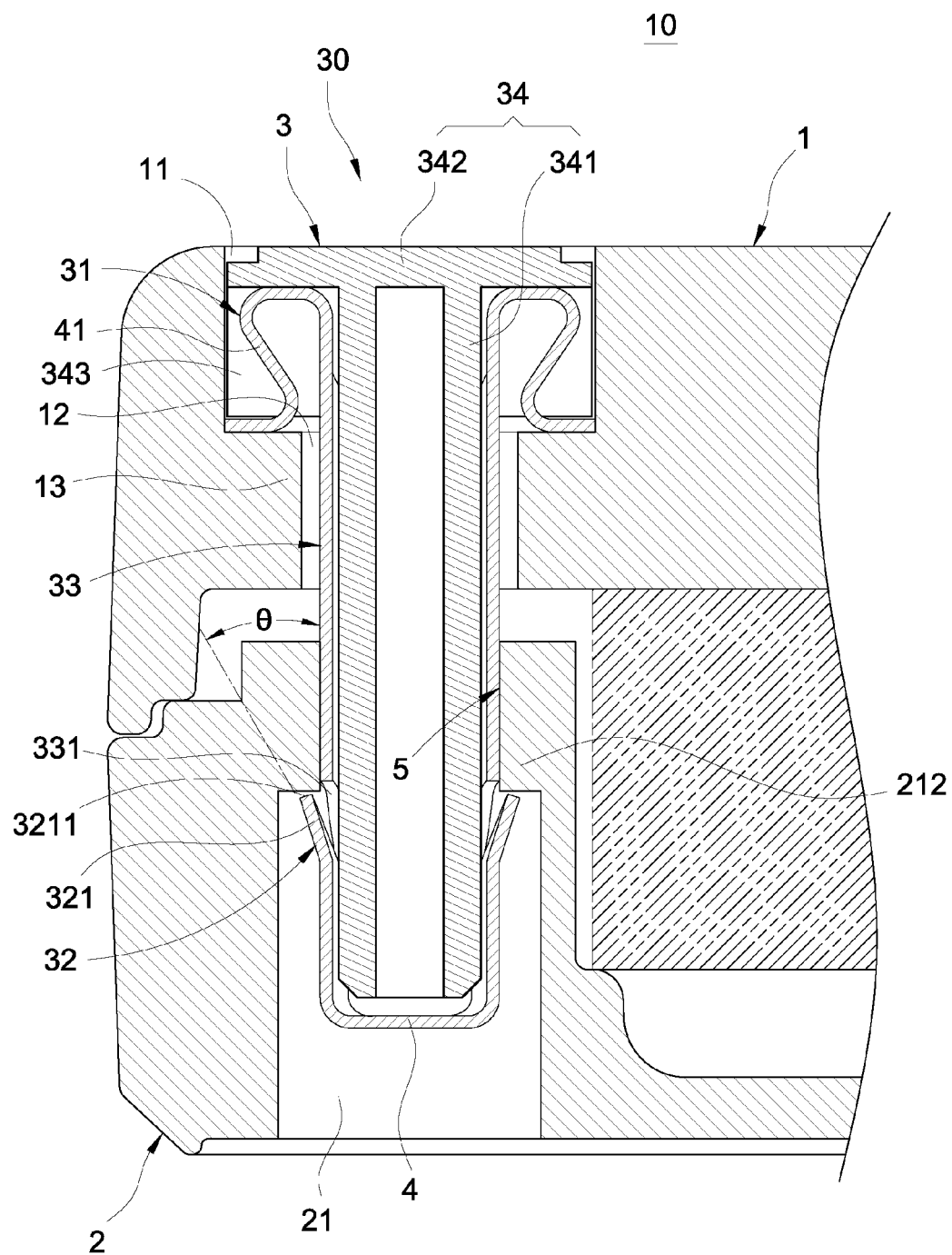
FIG. 9 is a schematic view of the casing device assembled according to another embodiment of the present invention.

Referring to FIG. 9, there is shown a schematic view of the casing device 10 assembled according to another embodiment of the present invention. The embodiment of FIG. 9 is substantially identical to the embodiment of FIG. 1 through FIG. 5. But the engagement structure 5 distinguishes the embodiment of FIG. 9 from the embodiment of FIG. 1 through FIG. 5.

As shown in FIG. 9, the engagement structure 5 comprises a stop ring 212 disposed on the inner wall of the penetrating hole 21. The plurality of resilient protruding plates 321 and the stop ring 212 are engaged with each other. Therefore, the embodiment of FIG. 9 equals the embodiment of FIG. 1 through FIG. 5 in functionality and performance.

Figure 10:
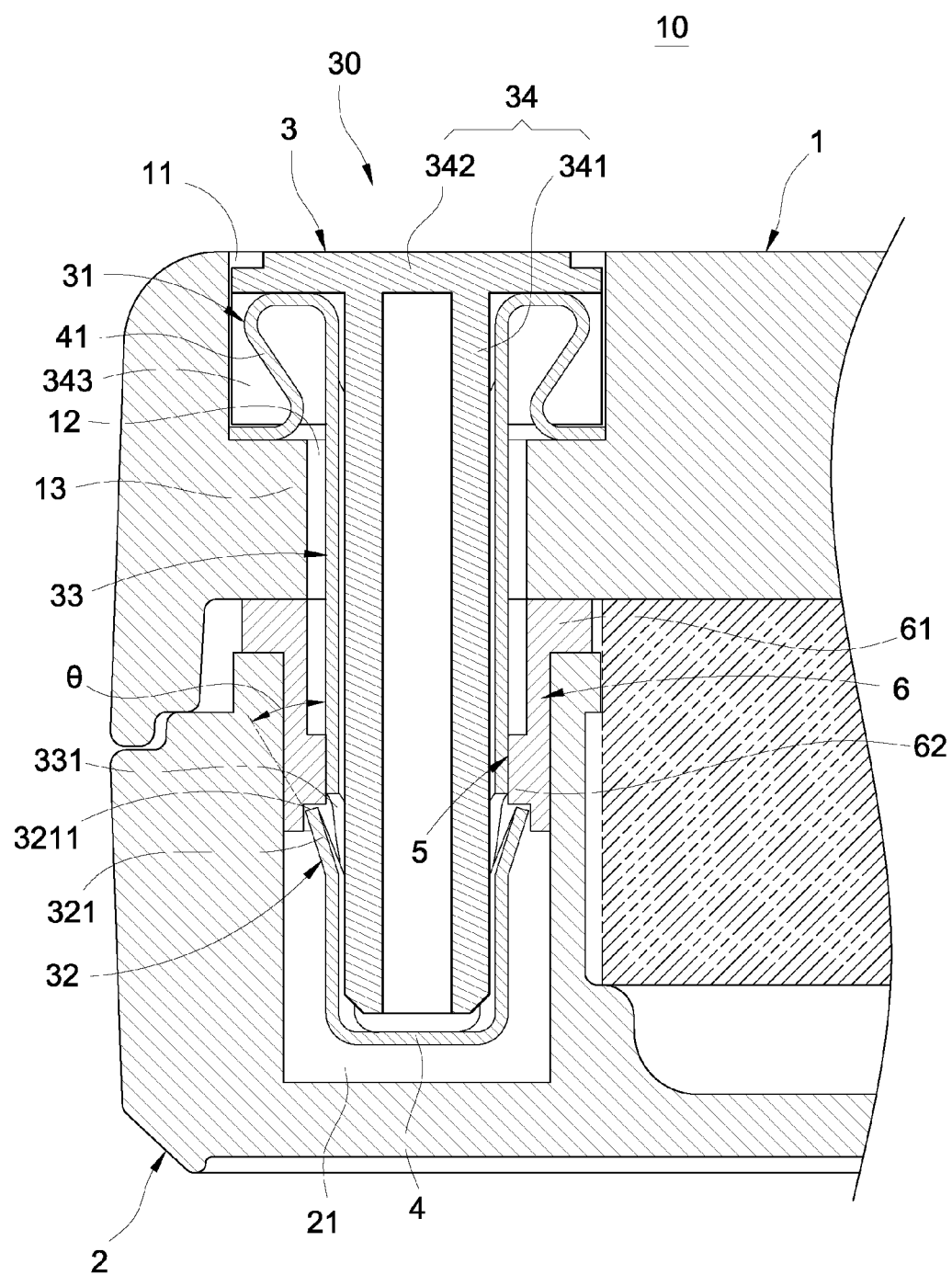
FIG. 10 is a schematic view of the casing device assembled according to yet another embodiment of the present invention.

Referring to FIG. 10, there is shown a schematic view of the casing device 10 assembled according to yet another embodiment of the present invention. The embodiment of FIG. 10 is substantially identical to the embodiment of FIG. 1 through FIG. 5. But the engagement structure 5 distinguishes the embodiment of FIG. 10 from the embodiment of FIG. 1 through FIG. 5.

As shown in FIG. 10, the casing device 10 further comprises a through pipe 6. The outer wall of the through pipe 6 extends to form a sandwiched block 61. The sandwiched block 61 is sandwiched between the first casing 1 and the second casing 2 such that the outer wall of the through pipe 6 abuts against the inner wall of the penetrating hole 21. The engagement structure 5 comprises a flange 62 which is disposed on the inner wall of the through pipe 6. The plurality of resilient protruding plates 321 and the flange 62 are engaged with each other. Therefore, the embodiment of FIG. 10 equals the embodiment of FIG. 1 through FIG. 5 in functionality and performance.

In conclusion, a casing device and insertion structures thereof of the present invention, which have never been applied to equivalent products or openly used, have novelty, non-obviousness, and high industrial applicability, thereby meeting requirements of patentability.

What is claimed is:
1. An insertion structure, comprising:
 a tamperproof element comprising a case sleeve and a penetrating post, wherein the case sleeve comprises an outer surface, an end extended outward to form two barb-like protruding portions and another end protrudingly provided with a leaf spring, wherein the leaf spring comprises a plurality of resilient protruding plates protrudingly formed on the outer surface;

wherein the penetrating post is penetratingly disposed in the case sleeve and abuts against the barb-like protruding portions; and wherein the penetrating post has a rod portion and a head portion extending from a top of the rod portion, with the rod portion penetratingly disposed in the case sleeve, wherein two slots are disposed laterally at a bottom of the head portion, respectively, allowing the two barb-like protruding portions to engage with the two slots and abut against inner walls of the slots, respectively.

2. The insertion structure of claim 1, wherein the barb-like protruding portions are made of a metal which exhibits resilience.

3. The insertion structure of claim 1, wherein the resilient protruding plates are disposed at an outer rim of the case sleeve, arranged spirally in one turn, and spaced apart from each other.

4. The insertion structure of claim 1, wherein the resilient protruding plates tilt and align with the barb-like protruding portions to extend, with an acute angle defined by and between each said resilient protruding plate and the outer surface.

5. The insertion structure of claim 1, wherein the case sleeve is formed from a U-shaped metallic strip, and the two barb-like protruding portions form two flaps by extending the two terminal ends of the U-shaped metallic strip outward and bending them reversely, wherein the resilient protruding plates are formed by cutting the U-shaped metallic strip bilaterally along a cutting line and then folding the U-shaped metallic strip outward about the cutting line.

6. A casing device, comprising:
a first casing with a surface having an opening and another surface having a through hole in communication with the opening;
a second casing having a penetrating hole in communication with the through hole, wherein the second casing and the first casing can be closed; and
the insertion structure of claim 1, wherein the tamperproof element is penetratingly disposed in the through hole and the penetrating hole, with the barb-like protruding portions abutting against a bottom of the opening, wherein the plurality of resilient protruding plates and an engagement structure disposed inside the penetrating hole are engaged with each other such that a portion of the first casing and a portion of the second casing are clamped between the barb-like protruding portions and the plurality of resilient protruding plates.

7. The casing device of claim 6, wherein the engagement structure comprises an internal thread disposed on an inner wall of the penetrating hole, wherein the plurality of resilient protruding plates and the internal thread are engaged with each other.

8. The casing device of claim 7, wherein the leaf springs are in a number of plurality and vertically spaced apart, wherein terminal ends of two adjacent ones of the resilient protruding plates vertically spaced apart are separated by a distance which is a multiple of a pitch of the internal thread.

9. The casing device of claim 6, wherein the engagement structure comprises a stop ring disposed on an inner wall of the penetrating hole, wherein the plurality of resilient protruding plates and the stop ring are engaged with each other.

10. The casing device of claim 6, further comprising a through pipe with an outer wall abutting against an inner wall of the penetrating hole, wherein the engagement structure comprises a flange disposed on an inner wall of the through pipe, wherein the plurality of resilient protruding plates and the flange are engaged with each other.

11. The casing device of claim 10, wherein the outer wall of the through pipe extends to form a sandwiched block sandwiched between the first casing and the second casing.

12. The casing device of claim 6, wherein an area of the opening is larger than an area of the through hole, thereby allowing the first casing to have an annular block formed at an outer rim of the through hole, wherein the annular block is sandwiched between the barb-like protruding portions and the plurality of resilient protruding plates.

13. An insertion structure, comprising:
a tamperproof element comprising a case sleeve and a penetrating post, the case sleeve comprising an outer surface, an end extended outward to form two barb-like protruding portions and another end protrudingly provided with a leaf spring, wherein the leaf spring comprises a plurality of resilient protruding plates protrudingly formed on the outer surface;
wherein the penetrating post is penetratingly disposed in the case sleeve and abuts against the barb-like protruding portions; and
wherein windows are disposed on the case sleeve and correspond in position to the resilient protruding plates, respectively, whereas bumps are protrudingly disposed at the penetrating post and protrudingly exposed from the windows, respectively.

14. A casing device, comprising:
a first casing with a surface having an opening and another surface having a through hole in communication with the opening;
a second casing having a penetrating hole in communication with the through hole, wherein the second casing and the first casing can be closed; and
the insertion structure of claim 13, wherein the tamperproof element is penetratingly disposed in the through hole and the penetrating hole, with the barb-like protruding portions abutting against a bottom of the opening, wherein the plurality of resilient protruding plates and an engagement structure disposed inside the penetrating hole are engaged with each other such that a portion of the first casing and a portion of the second casing are clamped between the barb-like protruding portions and the plurality of resilient protruding plates.

15. The casing device of claim 14, wherein the engagement structure comprises an internal thread disposed on an inner wall of the penetrating hole, wherein the plurality of resilient protruding plates and the internal thread are engaged with each other.

16. The casing device of claim 15, wherein the leaf springs are in a number of plurality and vertically spaced apart, wherein terminal ends of two adjacent ones of the resilient protruding plates vertically spaced apart are separated by a distance which is a multiple of a pitch of the internal thread.

17. The casing device of claim 14, wherein the engagement structure comprises a stop ring disposed on an inner wall of the penetrating hole, wherein the plurality of resilient protruding plates and the stop ring are engaged with each other.

18. The casing device of claim 14, further comprising a through pipe with an outer wall abutting against an inner wall of the penetrating hole, wherein the engagement structure comprises a flange disposed on an inner wall of the through pipe, wherein the plurality of resilient protruding plates and the flange are engaged with each other.

19. The casing device of claim 18, wherein the outer wall of the through pipe extends to form a sandwiched block sandwiched between the first casing and the second casing.

20. The casing device of claim 14, wherein an area of the opening is larger than an area of the through hole, thereby allowing the first casing to have an annular block formed at an outer rim of the through hole, wherein the annular block is sandwiched between the barb-like protruding portions and the plurality of resilient protruding plates.

\* \* \* \* \*